US010997852B1

(12) United States Patent
 Bierer

(10) Patent No.: US 10,997,852 B1
(45) Date of Patent: May 4, 2021

(54) LONG RANGE PHASING VOLTMETER WITH TRANSMISSION AND GRID PHASING

(71) Applicant: Walter S. Bierer, Ridgeway, SC (US)

(72) Inventor: Walter S. Bierer, Ridgeway, SC (US)

( * ) Notice: Subject to any disclaimer, the term of this patent is extended or adjusted under 35 U.S.C. 154(b) by 10 days.

(21) Appl. No.: 16/667,203

(22) Filed: Oct. 29, 2019

(51) Int. Cl.
 *G08C 17/02* (2006.01)
 *G01R 25/00* (2006.01)
 *G01R 15/26* (2006.01)

(52) U.S. Cl.
 CPC ............. *G08C 17/02* (2013.01); *G01R 15/26* (2013.01); *G01R 25/005* (2013.01)

(58) Field of Classification Search
 CPC ...... G08C 17/02; G01R 15/26; G01R 25/005; H04L 27/00; H04L 27/02; H04L 27/2602; H04B 1/707; H04B 1/7183
 See application file for complete search history.

(56) References Cited

U.S. PATENT DOCUMENTS

| | | | |
|---|---|---|---|
| 6,642,700 | B2 | 11/2003 | Slade et al. |
| 6,734,658 | B1 | 5/2004 | Bierer |
| 7,109,699 | B1 | 9/2006 | Bierer |
| 7,808,228 | B1 | 10/2010 | Bierer |
| 8,283,910 | B1 | 10/2012 | Bierer |
| 8,283,911 | B1 | 10/2012 | Bierer |
| 10,459,022 | B1 | 10/2019 | Bierer |

*Primary Examiner* — Orlando Bousono
(74) *Attorney, Agent, or Firm* — Michael A. Mann; Nexsen Pruet, LLC

(57) ABSTRACT

A wireless phasing voltmeter transmitting two bits per second includes a reference unit using two audio frequency pulses per second to modulate a radio frequency carrier wave for simplex transmission of phase information to a field unit. The time between the two data bits is proportional to the phase difference between the reference voltage waveform and a first GPS-signal based waveform. The audio frequency of the two audio pulses representing the two data bits points to the frequency of the electric grid, rising when the grid frequency is faster and falling when the grid frequency is slower. A meter probe measures the phase angle of the field conductor against a second GPS generated waveform. Comparison yields the phase angle difference between the field conductor and the reference conductor. The radio frequency simplex data transmission perhaps using a cellphone data link, transmitting lower data rates is more reliable over greater distances.

20 Claims, 5 Drawing Sheets

| PULSE AUDIO FREQUENCY | EQUIVALENT GRID FREQUENCY |
|---|---|
| 2900 | 61.00 |
| 2800 | 60.90 |
| 2700 | 60.70 |
| 2600 | 60.60 |
| 2500 | 60.50 |
| 2400 | 60.40 |
| 2300 | 60.30 |
| 2200 | 60.20 |
| 2100 | 60.10 |
| 2050 | 60.05 |
| 2040 | 60.04 |
| 2030 | 60.03 |
| 2020 | 60.02 |
| 2010 | 60.01 |
| 2000 | 60.00 |
| 1990 | 59.99 |
| 1980 | 59.98 |
| 1970 | 59.97 |
| 1960 | 59.96 |
| 1950 | 59.95 |
| 1900 | 59.90 |
| 1800 | 59.80 |
| 1700 | 59.70 |
| 1600 | 59.60 |
| 1500 | 59.50 |
| 1400 | 59.40 |
| 1300 | 59.30 |
| 1200 | 59.20 |
| 1100 | 59.10 |
| 1000 | 59.00 |

FIG.4

LONG RANGE PHASING VOLTMETER WITH TRANSMISSION AND GRID PHASING

TECHNOLOGY FIELD

The present disclosure relates to high voltage phasing voltmeters, and more particularly, to phasing voltmeters that transmit phase information over communication links, such as the phasing voltmeter disclosed in U.S. Pat. No. 8,283,911.

BACKGROUND

Three-phase, high-voltage, distribution and transmission lines comprise three energized conductors and a fourth, neutral, conductor. An energized conductor carries an electrical voltage that varies sinusoidally in its magnitude at a phase angle of 120 degrees from the two other energized conductors. These three conductors are generally identified as the A, B, C or 1, 2, 3 conductors, or equivalent, depending on the utility. In the simplest arrangement, the first phase, which may be the A (or 1) conductor, serves as a reference phase and is arbitrarily set at zero degrees. The B conductor carries the next phase, which is displaced 120 degrees from the A phase and 120 degrees in advance of the third phase, C, which is displaced 240 degrees behind the A phase.

When two sets of high voltage distribution and transmission lines are to be connected, the phases of the three conductors in the first set must match the phase of the conductor to which it is being connected. For example, an A phase conductor of one set is connected to an A phase conductor of the other set, a B phase to a B phase and so on for the three conductor pairs. In total, there are six possible ways to attach any two sets of three conductors. These six different connections will result in a different outcome for the device being powered—outcomes that are significant. Incorrectly-wired three-phase transformer banks, comprising three individual transformers, for example, can produce phase angles between 0 and 360 degrees in 30 degree steps. Accordingly, correct phase identification prior to connecting conductors is a practical concern and a safety concern to those who maintain high voltage distribution and transmission systems.

Tracing the phase identity of an individual conductor can be difficult in overhead distribution and transmission systems, and is very difficult in underground electrical systems. These systems may extend for many miles. Moreover, unauthorized digging or trenching up of an underground electrical system—unfortunately a common occurrence—may sever conductors and result in loss of phase identification. Natural disasters such as accidents, hurricanes, tornadoes, forest fires, high winds, snow, ice, earthquakes, floods, etc. may also result in loss of phase identification in above ground and underground transmission systems. Construction and restoration of these systems and verification of system records require accurate phase identification, conductor tagging, and mapping of the electrical transmission lines.

Measuring instantaneous voltages of two conductors determines their time-varying voltages and, accordingly, their phase difference. When the two conductors are far apart, the phase difference information has to be communicated over those distances. The transmission of that information and even the distance between conductors itself introduces errors in making this measurement.

The wireless transmission of the phase information may take place under difficult circumstances or over great distances, and the transmission errors that often result can have serious consequences. Eliminating, avoiding or correcting for errors improves the speed and accuracy of the phase identification process. More safely and accurately making these electrical conductor connections with minimum use of communications bandwidth and a minimum amount of data transfer would be distinctly advantageous in this process.

Measuring the phase difference indirectly between the voltages on electrical conductors per se is known. One system, disclosed in U.S. Pat. No. 6,642,700 issued to Slade et al and assigned to Avistar Inc., identifies phase angles of electrical conductors in remote locations by time stamping the zero crossing of the waveform. A time tag is transmitted over a full-duplex communications link between a field unit and a reference unit. At the reference unit, the phase angle is calculated from the time tag and displayed. The Avistar system uses the Global Positioning Satellite (GPS) system as its external clock for determining the exact time of the time tag. However, in order for this system to operate in real time, it requires either a half-duplex or full duplex, full-time, communications link of relatively high speed to transfer the time tag and the voltage information.

Another phase angle measurement system is described in U.S. Pat. Nos. 6,734,658 and 7,109,699, issued to the present inventor. In this system, a voltage waveform (that has been corrected for capacitive charging currents) is obtained by a master probe in measuring the voltage carried by a conductor in the field. The phase of this voltage waveform is then compared to the phase of another, reference, voltage waveform made by a supplemental probe. This reference voltage waveform provided via the supplemental probe is obtained by measuring the voltage waveform on a reference conductor and then transmitting the measurement wirelessly and in full duplex from the supplemental probe to the master probe. The phase difference between the master voltage waveform and the supplemental voltage waveform from the reference conductor is then displayed by the master probe. This system compensates for the phase shift introduced when a voltage waveform is sent from one probe to the other. Also, the transmitted voltage waveform is encoded onto a carrier wave by modulating that wave with the voltage information. This system also requires the use of a full-time half-duplex or a full-duplex communications channel of relatively high speed.

A third system is described in U.S. Pat. Nos. 6,734,658, 7,808,228, 8,283,910, and 8,283,911, issued to the present inventor. In this system, the voltage waveform carried by a reference conductor is compared by a reference probe to a precision 60 Hertz (abbreviated Hz) waveform synthesized from a GPS receiver waveform. The phase difference between these two waveforms, in the form of a nine-bit data waveform is transmitted over a distance, perhaps miles, to a receiver that decodes the data waveform to extract the phase difference, and then applies that phase difference to another precision 60 Hz waveform synthesized from the waveform from another GPS receiver to synthesize a surrogate reference wave identical to the original reference voltage waveform. This surrogate wave is forwarded to a (nearby) meter probe that is measuring the voltage on a field conductor. The meter probe can then compare the two waveforms to determine the phase angle between them. This system represents an improvement over the previous two systems relating to the communication system used for transmission because it can operate with a low-speed, simplex data channel.

These prior art systems use different ways to obtain and compare waveforms that represent the phases of voltages carried by reference and field conductors and have different communications requirements for transmission of information between reference and field conductors.

The Avistar system compares time tags of the field voltage waveform and reference voltage waveform. Comparison of the time tags of the zero crossing time of the alternating voltages reveals the phase differences between the two time-varying voltages.

The first Bierer system compares the phase of the reference conductor voltage to that of the field conductor voltage directly and compensates for the phase shift of the transmitted reference voltage resulting from the transmission distance to the master probe measuring the field conductor voltage.

The second Bierer system determines the phase angle between a reference conductor voltage and a precision 60 Hz waveform generated from a GPS waveform. This phase angle is transmitted to a distant receiver where a surrogate of the original reference conductor voltage is re-created. The phase difference between this locally-recreated, surrogate, waveform voltage and that of a conductor in the field can then be compared to determine the phase angle between the voltages carried by the reference conductor and the field conductors.

Despite these improvements in determining the phase difference between two separated conductors, there remains a need for a high voltage phasing voltmeter that is accurate, easy to read, and useable when the high voltage distribution or transmission lines are many miles apart and when the electric power grid may not be operating at its full nominal frequency.

Moreover, as more and more energy sources are connected to the electrical system, complications arise regarding grid stability. These sources, such as wind power and solar electricity, are generated as direct current and then converted to alternating current at grid frequency prior to connection. Because these sources are often intermittent, grid frequency may vary as some sources become available and others drop off the grid.

A system that meets these needs would operate notwithstanding lower quality data communications and greater distances between the reference electrical conductor and the electrical conductor in the field, and despite grid frequency not being at its nominal, design level.

SUMMARY

According to its major aspects and briefly recited, herein is disclosed a long-range, wireless, phasing voltmeter system that determines the instantaneous phase angle difference between the voltages carried by two electrical conductors. The electrical conductors may be separated by many miles. One of them may be designated as the reference voltage conductor for the entire grid and be at a fixed location, and available to electrical workers anywhere in the electric grid system who want to check the phase of a conductor.

The present system, moreover, can use even a marginal communications channel such as a simplex communications system and cellular data link because of its small data transfer requirements. With the present method and system, it is possible to determine phase information of any conductor anywhere on an electric power grid with respect to a designated reference conductor and do so accurately, in spite of electrical interference, despite the distance between conductors and other factors that might affect phase determination of two conductors.

A feature of the present disclosure is the use of the Global Positioning Satellite (GPS) system clock frequency to generate a precision waveform for obtaining the phase angle difference with respect to the voltage waveforms from the reference source and the field source. The GPS, one-pulse-per-second, clock frequency is used in the present disclosure to create a frequency waveform, a precise 60 Hz waveform, which nominally has the same frequency as the voltage on an electrical conductor in the electrical system.

The phase difference between the reference voltage waveform and the field voltage waveform and that of the precision frequency waveform is between 0 and 360 degrees. Because a GPS clock pulse rises at the same time everywhere, the GPS clock frequency received by the first unit for generating that precision frequency waveform will be in phase with the precision frequency waveform generated by the second unit at a field location regardless of the number of miles separating them. Accordingly, no distance-dependent adjustment is required to correct the measurement.

A feature of the disclosure is that the instantaneous phase difference between the standard waveform generated from the one-pulse-per-second GPS waveform and the waveform on the reference electrical conductor at a reference location is represented by two bits, audio pulses, of information per second. In particular, the interval of time between the two audio pulses is intended to be related to the magnitude of the phase difference between conductors.

In addition, the two bits are represented by two audio-frequency pulses that vary in audio frequency based on the grid frequency. The frequency of the voltage waveform on the reference electrical conductor which is 60 HZ by design but may vary between a little more or a little less than 60 Hz in practice, is represented by the specific audio frequency of the two audio pulses: the audio pulses will rise in pitch when the system frequency is a little faster than 60 Hz and the pitch will fall when the system frequency is a little slower than 60 Hz. The pitch and its nominal variations is generated so as to be audible so the utility worker can hear it and tell when the grid frequency is a little faster or slower. The present device will also quantify and display phase difference and system frequency.

Thus, two short audio pulses, representing a start bit and a stop bit, are transmitted, perhaps from miles away over a simple communications link such as a cellular connection. The time interval between the two data bits is related to the magnitude of the phase difference between the two electrical conductors. The pitch of the audio pulses, representing the data bits, changes with the frequency of the electrical system grid and can thereby inform as to the stability of the grid frequency.

These and other features and their advantages will be apparent to those skilled in the art of electric utility, high voltage measurements from a careful reading of the Detailed Description of the Disclosure accompanied by the following drawings.

BRIEF DESCRIPTION OF THE DRAWINGS

In the figures,

FIG. 4 is a table showing one example of audio frequencies for the pair of audio pulses that may be used to indicate the instantaneous grid frequency.

DETAILED DESCRIPTION

Figure 1:
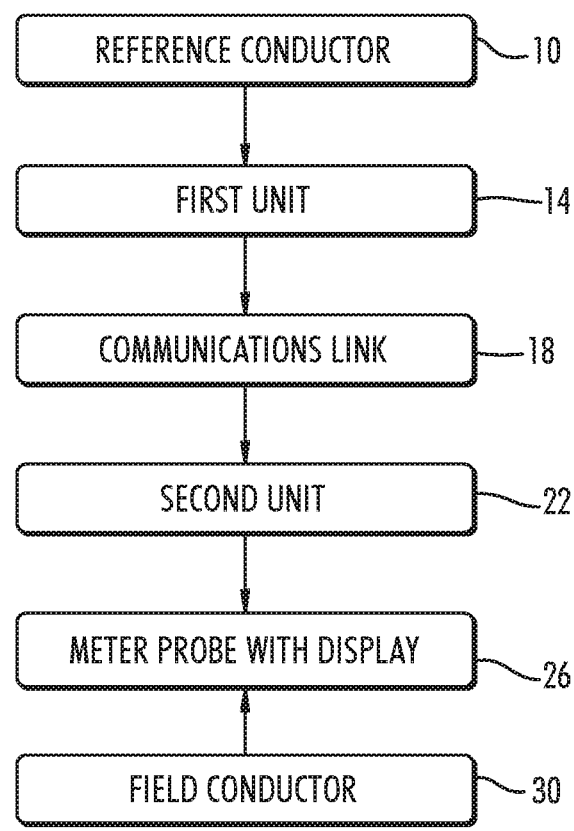
FIG. 1 is a simplex radio communications system connecting a first unit and a second unit via a communications link for measuring the phase angle between the waveforms of a reference conductor and a field conductor, according to an aspect of the disclosure.

Disclosed herein is an improved, long range, phasing voltmeter system. The improvements are in the system's ability to measure and transmit digital phase information at a data rate as slow as two bits per second over marginal communication links when necessary, such as those having minimal data speed and throughput requirements. Moreover, in addition to determining and transmitting phase information, the present long range phasing voltmeter system determines the electrical grid system frequency with respect to its design frequency, i.e., 60 Hz, or 50 Hz in some countries. Using the information thus transmitted, the present device accurately determines multiple parameters of an electrical system, including phase, phase angle, phase sequence, phase rotation, and system (grid) frequency. Moreover, it can do so when the reference and field conductors are separated by many miles and when the grid is not operating at its design frequency. With the present device, a utility could designate one electrical conductor to be the reference conductor for its entire grid and use that one electrical conductor to obtain complete phase information of the electrical waveform on any field conductor, even one that is miles away.

The present disclosure incorporates the teachings of the phasing voltmeter system disclosed and described in U.S. Pat. No. 6,734,658 that includes a supplemental probe, as well as the systems disclosed in other US patents, including U.S. Pat. Nos. 7,808,228, 8,283,910, and 8,283,911 that are commonly owned and are incorporated herein in their entireties by reference.

The supplemental probe described in U.S. Pat. No. 6,734,658 measures the time-varying voltage, or "waveform" on the "reference conductor" at a "reference location." The term "supplemental" as used in U.S. Pat. No. 6,734,658 is replaced herein with the term "reference." The "first unit" herein measures the voltage on a "reference conductor", which can be any conductor anywhere on the grid system. In fact, the "first probe" and the "reference conductor" may be replaced with a hardwired configuration that serves as a "reference conductor" for use system-wide as a reference source. For example, a reference conductor may be a designated electrical conductor located at an electrical power plant connected to the grid. In that configuration, no separate device designated as a "reference probe," in the sense of a portable measuring device, is used or needed for measuring and transmitting or receiving phase information of any conductor in the grid.

The "reference conductor" of a reference voltage waveform is equivalent to the conductor used by the "supplemental probe" in U.S. Pat. No. 6,734,658. Therefore, when the term "reference conductor" is used herein, it refers to either a conductor that a first reference probe is in contact with or to a reference source that is a hard-wired configuration designated to be the "reference conductor" of an alternating current and for use in determining phase information of conductors in the field.

In practice, the present long range phasing voltmeter displays to the utility worker the phase of the voltage on a conductor in the field, namely, a "field conductor," with respect to a reference conductor (or, in some applications, shows the phase angle differences are among several field conductors) so that the utility worker connect only those conductors of the same phase together. The utility worker may also wish to know the phase of a particular conductor, without particular regard to where it is, with respect to the utility's designated reference source.

The terms "phase difference" and "phase angle difference" are used herein interchangeably because phase difference is often expressed as an angle between zero and 360 degrees or zero and $2\pi$ radians. Regardless of the manner in which phase difference is expressed: degrees, radians, or otherwise, the present disclosure determines phase difference and displays it on a device programmed to display the phase difference in the manner of choice.

A voltage on a conductor may be a time-varying voltage. The time-varying voltage of an alternating current electrical system has a standard frequency, for example, 60 Hz (or 50 Hz in some parts of the world). One Hz, or "Hertz" is one cycle per second. A voltage waveform is an analog or digital representation of the time-varying voltage on such an electrical system and its individual conductors. The term communications link refers to means for transmitting information, which may be a wireless transmission or partially wireless, and which communications link may then use an electromagnetic frequency carrier wave to send information as a digital or analog waveform, or as a combination of a digital and analog waveform riding on the carrier.

Referring now to FIG. 1, the present system determines the phase of a reference conductor 10, which may be a conductor attached to an electric grid and conveniently designated as the reference conductor 10, and the phase of a field conductor 30, which may be attached to the same electric grid yet perhaps miles away. Phase determination is made with respect to reference conductor 10 using a first unit 14, a communications link 18, a second unit 22, a meter probe 26 with a display and a field conductor 30.

The designations of first unit 14 and second unit 22 are not arbitrary. First unit 14 is assumed to be near to and in electrical connection with reference conductor 10. Alternatively, the user may designate arbitrarily any conductor among a group of conductors to be reference conductor 10. The phase difference between any field conductor 30 in that group of field conductors may then be determined as the phase difference of field conductor 30 with respect to reference conductor 10.

Second unit 22 and meter probe 26 may be used in the field to determine the phase of a voltage waveform on field conductor 30, in comparison to the phase on reference conductor 10, and to display the results for the technician in the field.

As will be described in detail below, first unit 14 and second unit 22 cooperate to determine the phase difference between the electrical waveform on reference conductor 10 and that on field conductor 30 by comparing both to a third waveform. This third waveform is readily available to both first unit 14 and second unit 22 and therefore phase differences on these two conductors compared to that of the third waveform are equivalent to the phase difference between the phases of reference conductor 10 and field conductor 30, regardless of the distance separating reference conductor 10 and field conductor 30. The two phase differences thus obtained, that is, one phase difference between the waveform on reference conductor 10 and that of the third waveform, and the other phase difference between the waveform on field conductor 30 and that of the third waveform, can thus be compared by second unit 22. The result is the phase difference between the waveforms on reference conductor 10 and field conductor 30.

Meter probe 26 is used to sense the voltage waveform on field conductor 30. Meter probe 26 may be similar to the meter probe with a display shown and described in U.S. Pat. No. 6,734,658, which is incorporated by reference herein in its entirety.

Figure 2:
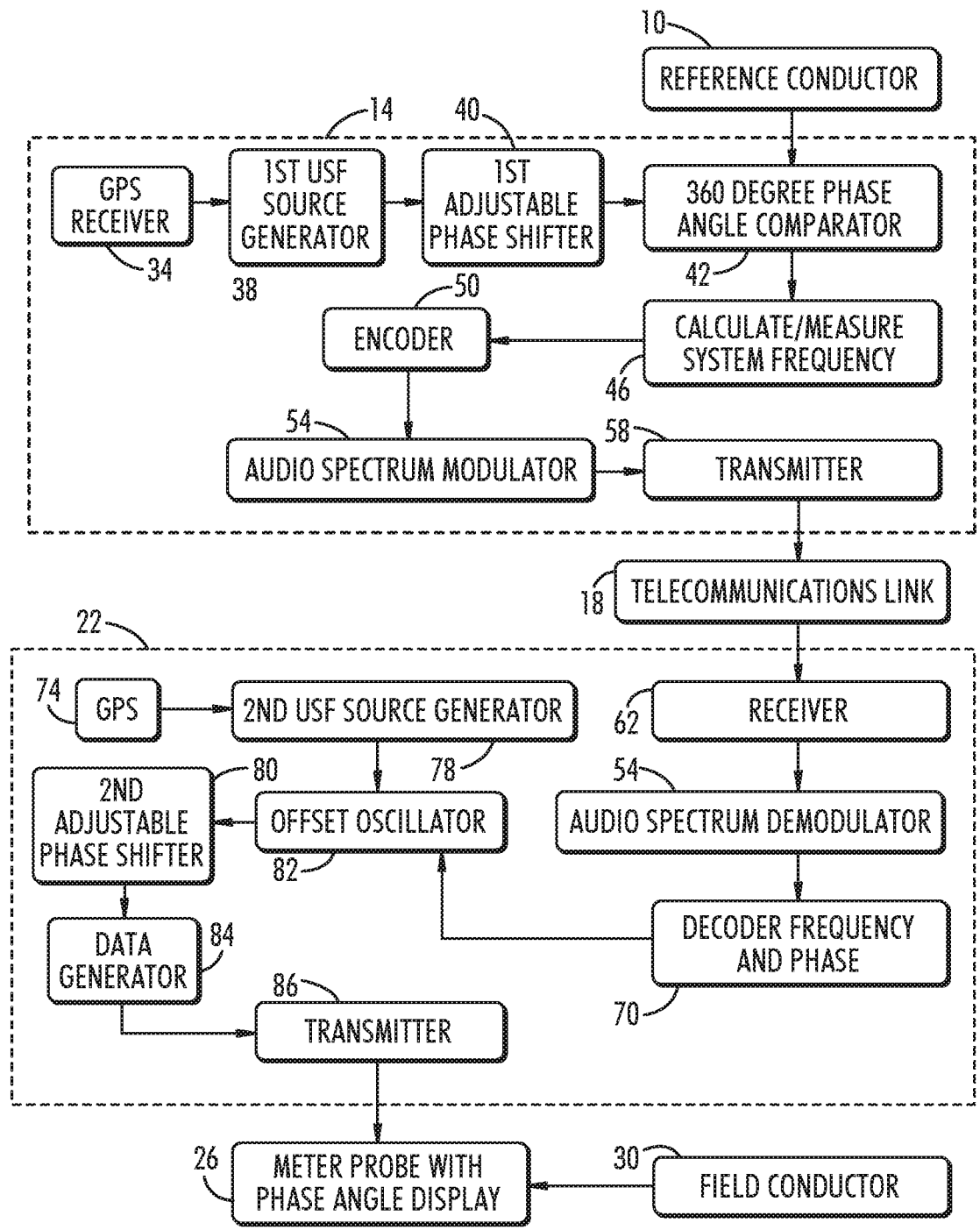
FIG. 2 is a schematic description of the first unit and second unit connected by a communications link, according to an aspect of the disclosure.
Figure 3:
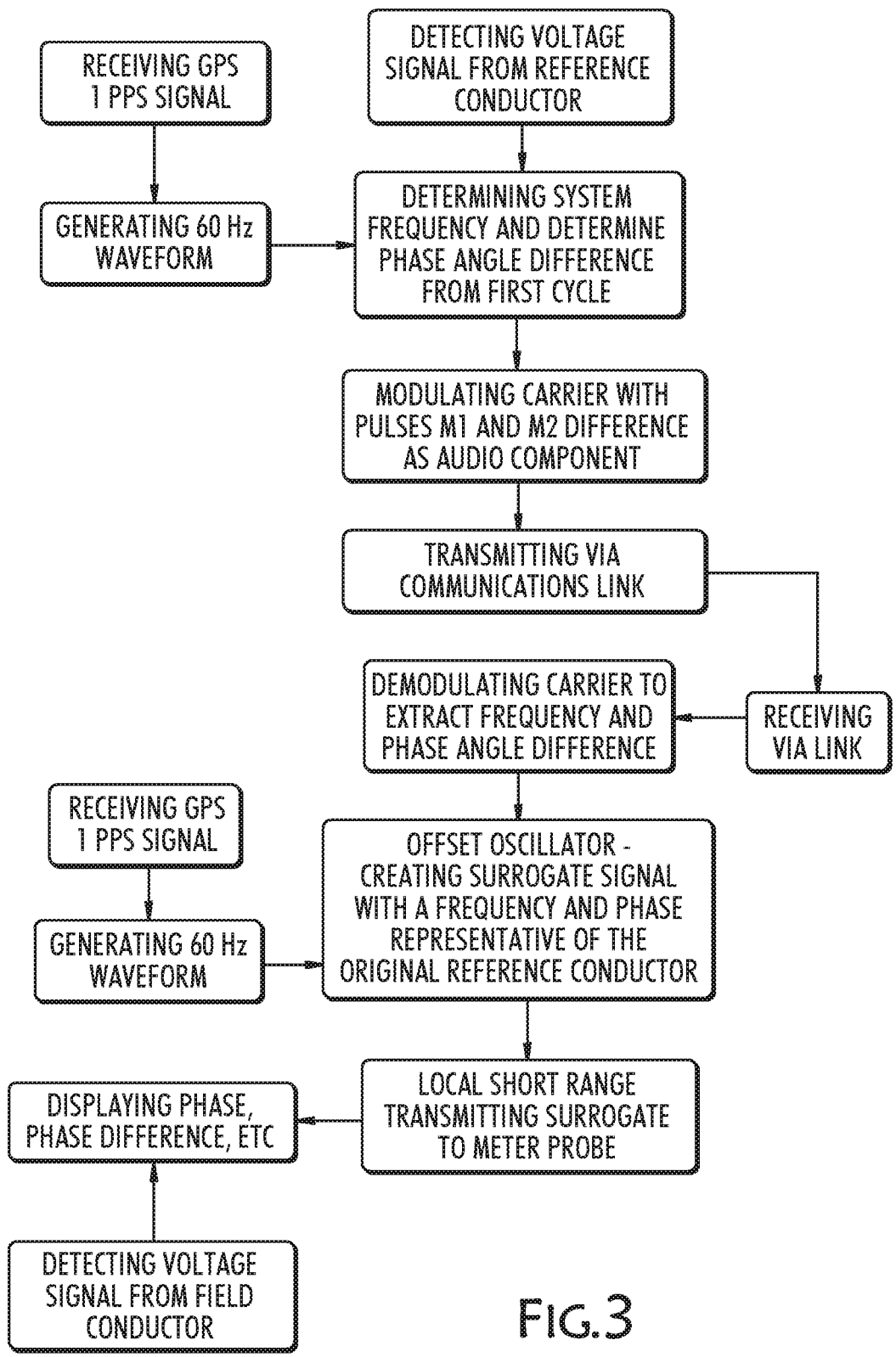
FIG. 3 is a flow diagram of the present method, according to an aspect of the disclosure.

FIG. 2 shows the internal components of first unit 14 and second unit 22. FIG. 3 is a flow diagram showing the operation of first unit 14, second unit 22, and meter probe 26 on the voltage waveforms carried on reference conductor 10 and on field conductor 30.

Referring now to FIGS. 2 and 3, first unit 14 includes a first GPS (Global Positioning Satellite) receiver 34 that receives the steady, one-pulse-per-second, clock pulse rate from the GPS system. The output of GPS receiver 34 feeds into a USFS (universal standard frequency source) generator 38 that receives the GPS one-pulse-per-second and generates a 60 Hz waveform from it.

First unit 14 is connected electrically to a reference conductor 10. At another location, which may be miles away, above or below ground, second unit 22 is connected to field conductor 30. Field conductor 30 is any electrical conductor that may be carrying an alternating electrical current, and which electrical conductor may be connected to the same electrical power grid that energizes reference conductor 10.

First unit 14 includes a first GPS receiver 34 that detects and outputs a one (clock) pulse-per-second (abbreviated as PPS) signal based on the 1 PPS emitted from satellites of the GPS system. These pulses will be referred to herein as clock pulses. The output of first GPS receiver 34 is forwarded to first USFS generator 38 that generates a waveform with a period equal to precisely 1/60th of a second, synchronized to the GPS one pulse-per-second signal.

First unit 14 includes a first adjustable phase shifter 40 that receives the waveform from first USFS generator 38 and enables the user to adjust the phase of the waveform from first USFS generator 38. For example, if reference conductor 10 carries a voltage waveform that has passed through a delta-wye transformer, its phase and other conductors on that side of the delta-wye transformer will have been shifted by 30 degrees. If so, first adjustable phase shifter 40 can be used to adjust the phase being received from USFS generator 38 by 30 degrees in the opposite direction before being received by 360-degree phase angle comparator 42 so that the voltage signal received is either an A phase conductor at zero degrees, a B phase conductor at 120 degrees or a C phase conductor at 240 degrees, respectively.

Next, the 360-degree phase angle comparator 42 compares the waveform output by USFS generator 38, after being shifted if necessary by first adjustable phase shifter 40, to the waveform present on reference conductor 10 in order to determine the phase of reference conductor phase 10. In addition, first unit 14 includes a system frequency calculator 46 that measures the frequency of the waveform obtained from reference conductor 10. Accordingly, both the phase angle between the GPS 60 HZ waveform, as shifted, and the waveform on reference conductor 10, and the frequency of the waveform on reference conductor 10, are obtained by first unit 14. Both will be encoded by encoder 50 and used by audio spectrum modulator 54 to modulate a carrier wave transmitted by transmitter 58.

Audio spectrum modulator 54 modulates the carrier wave, which may be a radiofrequency carrier wave, by encoding the information in an audio frequency. The information to be transmitted as am audio frequency modulation of the radio frequency carrier wave includes the reference conductor phase and the grid frequency. The reference conductor phase is obtained from 360-degree phase angle comparator 42 by comparing the reference conductor waveform to the adjusted waveform produced by first USFS source generator 38. The grid frequency is determined by comparing system frequency, as manifested by the frequency of the waveform on reference conductor 10 to the GPS frequency.

The phase of reference conductor 10 and the grid frequency of its waveform are forwarded to an encoder 50 that generates two audio frequency pulses, one delayed with respect to the other by an interval of time related to the phase difference, and both pulses pitched at an audio frequency related to the grid frequency in a manner to be described below.

The modulated carrier wave is forwarded to transmitter 58. These two audio pulses are different from the clock pulses output by the GPS system that are used to mark the passage of one second of time. These two audio pulses mark the start and the end of an interval of time which interval is an way to encode the phase of the reference conductor, as will be explained below.

In order to determine phase information from reference conductor 10, first unit 14 constructs a 60 Hz waveform from a one-clock-pulse-per-second signal from GPS Receiver 34 using first USFS generator 38. A second voltage waveform is obtained from reference conductor 10. These first and second waveforms are compared to each other using 360-degree phase angle comparator 42. To make that determination, first unit 14 looks for a repeating electrical value or feature in the voltage waveform from reference conductor 10. This electrical value or feature may be, for example, a change from negative to positive voltage or a positive-to-negative change in the first derivative of the voltage—but any readily detectable characteristic of a sinusoidally-varying voltage can be used. Next, the phase difference is determined.

Figure 5:
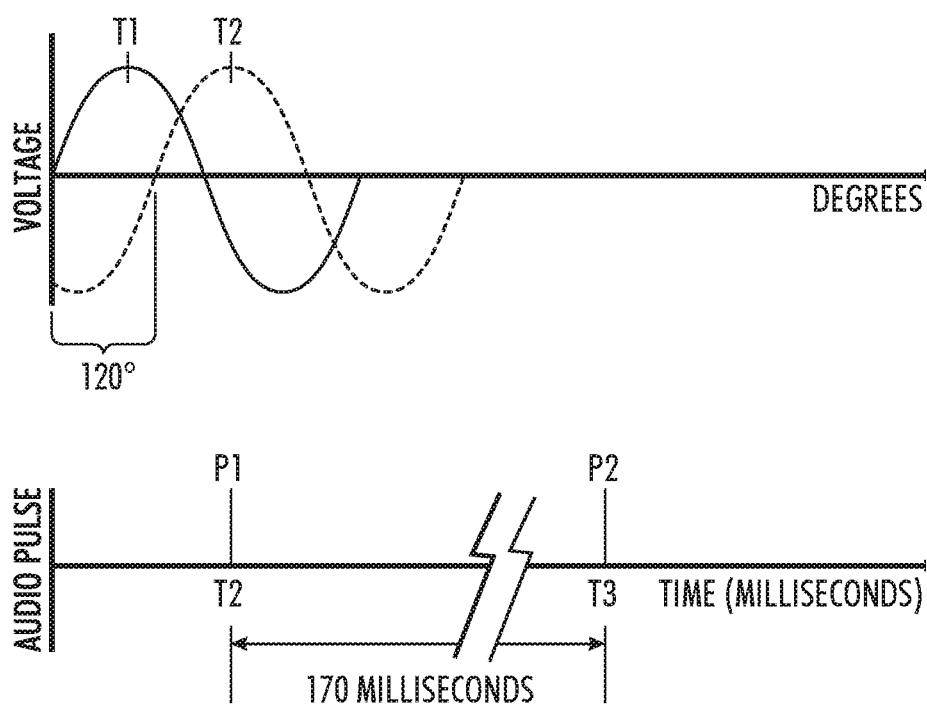
FIG. 5 is a diagram showing the relationship of the two pulses to the voltage signal from which they are derived.

FIG. 5 shows an aligned pair of graphs. The upper graph shows voltage versus time for two 60 cycles per second, voltage waveforms. The darkened waveform represents the voltage output of the USFS generator. The dashed waveform represents the voltage from the reference conductor which is displaced by 120 degrees but may be displaced by anywhere from zero to 360 degrees. The bottom graph shows the two pulses generated by the present phasing voltmeter 10 that repeat every second. As illustrated in FIG. 5, upper graph, the phase angle between T1 and T2 is measured from receipt of the start of the first cycle of the USFS 60 Hz waveform until the detection of a significant repeating electrical value or feature of the 60 Hz reference waveform. As shown in FIG. 5, the significant repeating electrical value in this example is the change in the first derivative of the voltage, that is, when the voltage stops increasing. This phase angle, between T1 and T2 is measured in degrees by 360-degree phase angle comparator 42. The occurrence of the significant repeating feature triggers an audio pulse P1 at time T2 by 360-degree phase angle comparator 42.

The P1 pulse may be followed by an arbitrary, preselected delay, such as, for example, 50 milliseconds. Encoder 50 then adds an additional amount of time in milliseconds to that preselected delay that is proportional to the number of degrees of phase difference. The magnitude of the phase difference in degrees may be represented by the same numerical value expressed in milliseconds. In the present example, after the arbitrary 50 milliseconds of delay after audio pulse P1 at T2, a phase difference of 120 degrees, for example, may be represented by an additional delay of 120 milliseconds. The sum of the arbitrary delay of 50 milliseconds and the phase difference of 120 degrees for the phase difference, totals 170 milliseconds, which determines the time, T3, when the second audio pulse, P2, occurs. Thus, audio pulse P2 follows audio pulse P1 by 170 milliseconds in this example and as shown in the lower graph of FIG. 5. The two pulses, P1 and P2, may be repeated every second. An audio spectrum modulator 54 modulates an electromagnetic carrier wave using audio frequency audio pulses P1 and then P2, which pulses are transmitted repeatedly every second by transmitter 58 to second unit 22 via communications link 18.

Audio spectrum modulator 54 is a variable frequency audio spectrum modulator that applies audio pulses P1 and P2 to a carrier wave having an output frequency representative of the electrical system frequency.

The phase difference, represented by the time in milliseconds separating audio pulses P1 and P2, and the frequency of the system, represented by the audio frequency of audio pulses P1 and P2, are transmitted by transmitter 58 of first unit 14 to a receiver 62 at second unit 22. There, an audio spectrum demodulator 70 detects the frequency of audio pulses P1 and P2, and counts the milliseconds of time between them. The time difference between audio pulses P1 and P2 is sent to a decoder 70, which removes the (known) additional delay between the audio pulses P1 and P2, and determines the phase of reference conductor 10 with respect to a USFS 60 Hz. In addition, the audio spectrum demodulator 66, extracts the audio pulses P1 and P2, which, upon decoding reveals the frequency of the grid about its nominal 60 Hz.

As an example, if the interval of time between P1 and P2 is 290 milliseconds, that difference, less the 50 milliseconds of arbitrary delay, leaves 240 milliseconds, which corresponds to 240 degrees of phase difference. If reference conductor 10 is designated as the A-phase conductor, then field conductor would be a C-phase conductor. The elapsing of 240 degrees between the occurrence of the first audio pulse P1 on which the waveform was generated by first unit 14 and the occurrence of the first significant repeating feature on the waveform of reference conductor 10 is based on a one pulse per second GPS clock pulse.

The arbitrary delay of 50 milliseconds in the present example, allows resolution of the first and second pulses, especially when the phase difference is small or zero. An electronics circuit may not be able to resolve or detect two distinct audio pulses if the time between them too short, and it is possible the phase difference could be zero. Accordingly, introducing an arbitrary delay removes the issue of resolution. A shorter preselected delay can be used along with good quality components of the circuitry may be used for resolution of the two audio pulses per second if they occur within a small fraction of a second apart.

The choice of one millisecond to represent one degree is also arbitrary. With 1000 milliseconds in a second, however, a longer or a shorter time could be used as an equivalent to one degree of phase difference as long as a phase difference of up to 360 degrees plus the arbitrary delay can be represented within one second. The "one second" limit for transmitting the P1 and P2 with the interval of time between P1 and P2 spacing them apart is thus somewhat arbitrary, but convenient.

A feature of the present disclosure is the transmission of the instantaneous phase difference and the system (or grid) frequency from first unit 14 to second unit 22. The transmission of the phase difference once per second together with information about the grid frequency, wherein the interval between the two data bits conveys the phase difference and the frequency of the two audio pulses encodes the grid frequency, is an aspect of the disclosure. FIG. 4 is a table showing an example of how audio frequencies can be assigned to grid frequencies so that a utility worker, listening to the set of pulses, can hear when the grid is faster or slower. In the example of Table 4, the audible frequency ranges from 1000 Hz to 3000 Hz, a range that is easily heard by humans. Using this range and assigning 2000 Hz, the middle of the range, to represent 60 Hz is also arbitrary.

The closer to 2000 Hz, the closer the grid frequency is operating at a nominal 60 Hz. The tone will rise as the grid frequency speeds up and will fall when the grid frequency slows which intuitively corresponds because of the inherent urgency conveyed by higher pitches.

The example ranges from 59.9 Hz to 60.1 Hz, which is representative of the frequency variation of the US grid system but could be expanded to 59.0 Hz to 60.0 Hz for less stable grids and for grids that receive power from sources where the electrical current is created by direct current sources, such as solar electric energy or variable direct current sources such as wind energy, and must be inverted before being connected to an alternating current power grid.

The phase of the alternating current on reference conductor 10 is compared indirectly to the phase of the alternating current on field conductor 30 by comparing the phase of the reference conductor and that of field conductor 30 to waveforms generated from the GPS 1 PPS signal.

Second unit 22 will receive phase and frequency information determined by first unit 14, which has been transmitted over telecommunications link 18. Telecommunications link 18 may be a cellular data link, for example, and will transmit phase information in one direction from first unit 14 to second unit 22. The comparison of the phase of reference conductor 10 with the phase of field conductor 30, as described below, will reveal the absolute phase, the phase difference, the phase rotation, the phase sequence, and grid frequency of the alternating current carried by field conductor 30 with respect to reference conductor 10.

Because the length of time used for transmission between the first unit 14 and the second unit 22 is on order of milliseconds, the communication channel is idle most of the time. This feature allows the transfer of the phase information and system frequency via a part time, one-way, simplex communication link, which uses a lower throughput data rate as opposed to either a full-time, simplex or a full-duplex communications system that requires a much higher throughput data rate. The modest transmission requirements of the present system is a feature of the disclosure because it enables simpler transmission systems to be used, transmission systems that operate over longer distances and over uneven terrain and in metropolitan areas.

As illustrated in FIG. 3, and with reference to FIGS. 1 and 2, a receiver 62 in second unit 22, at a location near a field conductor 30, receives the transmission from transmitter 58 of first unit 14 via communications link 18. The transmission may use an audio-modulated, radio-frequency carrier wave. In second unit 22, receiver 62 picks up the carrier wave transmitted by transmitter 58 of first unit 14 and forwards it to audio spectrum demodulator 66. Audio spectrum demodulator 66 demodulates the received waveform from the carrier wave to extract the train of pulse pairs and their audio frequency from the carrier frequency.

This pulse information is forwarded to a decoder 70 to decode the phase difference between the GPS waveform produced by USFS Generator 38 and the waveform of reference conductor 10, namely, the time gap between each pair of pulses in the transmission. The time difference in milliseconds between the two pulses, less the preselected "additional amount" added to assure resolution when the phase difference is small, equals the phase angle difference between the current carried by reference conductor 10 and the waveform created from the 60 Hz GPS signal. The frequency or "pitch" of the audio pulses on the transmitted carrier wave corresponds to a grid frequency obtained using a table, such as the example shown in FIG. 4. Decoder 74 then forwards the reference phase angle and system frequency as digital waveforms to 360-degree phase angle comparator 42.

The decoded phase of reference conductor 10 is then fed into an offset oscillator 82 in parallel with a second GPS-pulse-based voltage that was also generated using a one-pulse-per-second signal from GPS receiver 74 and a second GPS waveform generated by second USFS generator 78. The offset oscillator offsets the second GPS waveform by the phase difference received from first unit 14 thereby creating a surrogate waveform for unit 22 identical to that of reference waveform generated in unit 14. That surrogate waveform may be transmitted by radio frequency transmitter 86, which may be a short range transmitter given the proximity, to meter probe 26. The surrogate waveform may then be used for comparison directly to a field waveform detected on field conductor 30 by meter probe 26. As described in U.S. Pat. No. 6,734,658, referenced above and previously incorporated by reference, the result of that comparison is the phase difference between reference conductor 10 and field conductor 30.

Second unit 22 may optionally also have a user-adjustable phase shifter 80, shown in dashed lines in FIG. 2, in the event the user wishes to adjust the phase of surrogate waveform. First unit 14 may include an adjustable phase shifter 80 that allows the user to arbitrarily adjust the waveform of the reference conductor to being any angle between 0° and 360°. If the reference conductor 10 is known to be the "B" conductor, adjustable phase shifter 80, as shown in FIG. 2, can be set to 120 degrees to adjust the output of offset oscillator 82 prior to transmission by transmitter 86 to meter probe 26. For example, any field conductor 30 in phase with reference conductor 10 would then also be a "B" conductor and any conductor 240 degrees out of phase with the B conductor will be designated an "A" conductor. The phase angle adjuster 80 thereby allows the electric utility to select the phase in its system it wants to establish as the leading phase.

The surrogate waveform can be shifted using adjustable phase shifter 80 and then encoded as a 60-bps data stream by a data generator 84 prior to transmission via radio frequency transmitter 86 to meter probe 26. Data generator 84 synchronizes a 60-bps data stream with the waveform information associated with the newly-created 60-Hz surrogate waveform to present the frequency-shifted waveform for comparison with the voltage signal on field conductor 30. Meter 26 will then be able to display multiple parameters of an electrical system such as, phase, phase angle, phase sequence, phase rotation, system frequency, voltage and voltage difference.

A display, as disclosed in U.S. Pat. No. 6,734,658, for a master probe, can be used as meter probe 26 to display phase, phase angle, phase sequence, phase rotation, system frequency, voltage and voltage difference between the reference conductor and the field conductor as well as the other parameters mentioned above.

The reference and field conductors 10, 30, respectively, may be an unknown distance apart and still be used to determine phase difference and system frequency as long as telecommunications link 18 can establish communication. Indeed, waveforms from reference and field conductors 10, 30, many miles apart may be compared using the present apparatus to determine their phases and phase angles.

The system's carrier wave may be a radio frequency carrier wave that audio spectrum modulator 54 modulates using an audible waveform. The system's transmitter may be a simplex transmitter that transmits the modulated carrier wave at regular intervals, such as every second. The electrical system's transmission frequency is represented by the audio frequency of the audio burst of audio pulse pairs. The phase angle difference and grid frequency may thus be represented by just two digital bits per second, transmitted as two audio pulses spaced by an interval of time, via a simplex communications system.

First unit 14 and second unit 22 may include probes as described in U.S. Pat. No. 6,734,658 (allowing for the changes in terminology previously described) that measure the voltages of reference conductor 10 and field conductor 30, respectively, and produce corresponding digital or analog voltage waveforms.

First unit 14 and second unit 22 may communicate through any type or class of communications link 18, including one using a wireless waveform, preferably a radio frequency waveform that permits the waveform to be transmitted accurately over long distances despite objects and topographic features that may exist between first unit 14 and second unit 22. Communications link 18 may be a simplex system rather than duplex, as the waveform is transmitted in one direction.

GPS receivers 34, 74, may be inexpensive, off-the-shelf items capable of providing a stream of pulses at the rate of 1 PPS synchronized to the standard second, plus or minus 1 micro-second, and referenced to Universal Standard Time. Any number of these 1 pps GPS receivers will produce output pulses that will rise in unison, regardless of where they are on earth.

Sixty Hertz (and 50 Hz) USFS generators 38, 78, are universal standard frequency sources. A USFS generator includes a microprocessor with its own precision internal clock used to generate a local precision frequency source of 60.00000 Hz (or 50.00000 Hz in locations where the electrical transmission frequency is 50 Hz). The number of zeros in the frequency value presented here represents the precision of these generators. The 60 Hz universal frequency generators 38, 78, as described herein, are based on the 1 pps output of GPS receivers 34, 74, and are not merely synchronized with the GPS output. A cycle of first and second USFS generators 38, 78, will have the same frequency and phase regardless of where they are anywhere on earth when receiving the 1 PPS waveform from GPS receivers 34, 74.

The outputs of the 60 Hz USFS generators 38, 78 are waveforms that may be sinusoidal or have some other shape, and preferably has a shape that has a fairly steeply rising edge such as a square pulse or rectangular pulse.

The system frequency determined by first unit 14 may be used to modulate an audible waveform with a stepped frequency oscillator, a form of frequency shift keying, preferably in the audio frequency range of 1000 and 3000 Hz for the digital pulses. In telephony, the usable voice frequency band ranges from about 300 Hz to 3400 Hz, so 1000 Hz to 3000 Hz is within this band and wide enough to be used to represent changes in the system frequency readily detectable by the human ear. The alternating electrical current system frequency in the United States may range from 59.00 Hz to 61.00 Hz. FIG. 4 represents a table showing an example of the correspondence between audio frequency and system frequency that may be used to code system frequency as an audio frequency of the pulses used to convey the phase difference between the reference conductor and the field conductor.

The coding and decoding may be done electronically so the table of correspondence, such as that shown in FIG. 4, merely has to have a designated frequency for the pulses that corresponds to a system frequency. However, having a frequency correspondence that inherently informs a technician that the system frequency is running a little faster or a little slower has inherent value to the technician. Thus, a rising audio frequency that corresponds to a rising system frequency in inherently preferable over the result of a different table of correspondence.

Frequency shift keying is a well-known method of modulating a carrier for the type of transmission described herein. Alternately, a pulsed data stream containing the phase angle difference and system frequency information could be used and would be of such short duration that it might, in the alternative, be converted to synthesized speech. Still other, optional techniques for transmitting audible waveforms via a modulated radio frequency carrier include dual-tone multi-frequency (DTMF) and audio frequency spread spectrum.

Accordingly, the present disclosure reduces the amount of data that needs to be transmitted and eliminates the need for full- or half-duplex transmission, and it optionally transmits the data at a modulation frequency in the same manner as routine telephone conversation, in the form of a pair of audio frequency pulses, in order to enable simplex transmission, and even marginal quality transmissions, of accurate phase angle information over great distances.

Determining instantaneous phase angle differences has a different outcome depending on whether the USFS generator waveform is compared to the voltage waveform or the other way around. The comparison may be done by first unit 14 and second unit 22, proceeding in either order to produce useful results and that are equivalent.

Those skilled in the art of high-voltage measurement and transmission and grid management will appreciate that modifications and substitutions may be made to the embodiments described herein without departing from the spirit and scope of the present disclosure, which is defined by the appended claims.

What is claimed is:

1. A method for determining a phase angle difference, said method comprising the steps of:
    (a) generating a first waveform from a one-clock-pulse-per-second waveform received from a global positioning satellite system;
    (b) obtaining a reference voltage waveform from a reference conductor;
    (c) determining a first instantaneous phase difference between said first waveform and said reference voltage waveform;
    (d) coding said first instantaneous phase difference as two pulses spaced apart by an interval of time;
    (e) transmitting said two pulses on a carrier wave;
    (f) receiving said carrier wave with said two pulses;
    (g) decoding said interval of time from said two pulses to yield said first instantaneous phase difference; and
    (h) generating a second waveform from said one-clock-pulse-per-second waveform;
    (i) obtaining a field voltage waveform from a field conductor;
    (j) offsetting said second waveform by said first instantaneous phase difference to generate a surrogate waveform matching said reference waveform; and
    (k) comparing said surrogate waveform to said field voltage waveform to determine a phase difference with respect to said reference conductor.

2. The method as recited in claim 1, wherein said interval of time is proportional to said phase difference.

3. The method as recited in claim 1, wherein said interval of time is proportional to said phase difference plus an additional amount of time.

4. The method as recited in claim 1, wherein said two pulses are repeatedly transmitted.

5. The method as recited in claim 1, wherein said two pulses are repeated every second.

6. The method as recited in claim 1, wherein said carrier wave is a radio frequency carrier wave.

7. The method as recited in claim 1, wherein said two pulses are audio-frequency pulses.

8. The method as recited in claim 1, wherein said carrier wave is modulated by frequency shift keying, audio frequency spread spectrum, or synthesized speech.

9. The method as recited in claim 1, wherein said reference voltage waveform on said reference conductor operates on a grid frequency, and wherein said two pulses are generated to have an audio frequency that corresponds to said grid frequency.

10. A system operable to determine a phase angle difference between a voltage waveform on a reference conductor and a voltage waveform on a field conductor, said system comprising:
    (a) a first unit operable to be connected to a reference conductor that carries a reference voltage waveform, said first unit including
        (i) a first Global Positioning Satellite (GPS) receiver operable to produce a one pulse per second signal,
        (ii) a first Universal Standard Frequency Source (USFS) generator operable to generate a first waveform from said one pulse per second signal from said first GPS signal,
        (iii) a first phase angle comparator operable to measure a first phase angle difference between said first voltage waveform and said reference voltage waveform,
        (iv) an encoder operable to encode said first phase angle difference as two pulses separated by an interval of time,
        (v) a transmitter operable to generate a carrier wave, and
        (vi) a modulator operable to modulate said carrier wave with said two pulses separated by said interval of time
    (b) a telecommunications link operable to deliver said carrier wave with said two pulses; and
    (c) a second unit, comprising:
        (i) a receiver operable to receive said carrier wave delivered by said telecommunications link,
        (ii) a demodulator connected to said receiver and operable to extract said two pulses from said carrier wave,
        (iii) a decoder connected to said demodulator and operable to decode said first instantaneous phase angle difference from said two pulses separated by said interval of time,
        (iv) a second GPS receiver operable to produce a one pulse per second signal,
        (v) a second USFS generator operable to generate a second waveform from said one pulse per second signal from said second GPS receiver, (vi) an offset oscillator operable to receive said first instantaneous phase angle difference from said decoder and said second waveform received from said second USFS generator and to offset said second waveform by said first instantaneous phase angle difference thereby creating a surrogate waveform replicating said reference voltage; and (vii) a second transmitter connected to said second unit and operable to transmit said surrogate waveform;

(d) a second transmitter connected to said second unit and operable to transmit said surrogate waveform; and (e) a meter probe operable to receive said surrogate waveform from said second transmitter, to detect a third waveform from a field conductor, to compare said surrogate waveform to said third waveform, and to determine a phase difference between said third waveform on said field conductor and said surrogate waveform.

11. The system as recited in claim 10, wherein said carrier wave is a radio frequency carrier wave.

12. The system as recited in claim 10, wherein said modulator modulates said carrier wave using an audible waveform.

13. The system as recited in claim 10, wherein said modulator modulates said carrier wave using frequency shift keying.

14. The system as recited in claim 10, wherein said modulator modulates said carrier wave using synthesized speech.

15. The system as recited in claim 10, wherein said interval of time is proportional to said phase difference.

16. The system as recited in claim 10, wherein said interval of time is proportional to said phase difference plus an additional amount of time.

17. The system as recited in claim 10, wherein said two pulses are repeated.

18. The system as recited in claim 10, wherein said carrier wave is a radio frequency carrier wave.

19. The system as recited in claim 10, wherein said two pulses are audio-frequency pulses.

20. The system as recited in claim 10, wherein said reference voltage on said reference conductor operates on a grid frequency, and wherein said two pulses have an audio frequency that corresponds to said grid frequency.

* * * * *